United States Patent
Zhang et al.

(10) Patent No.: US 12,230,307 B2
(45) Date of Patent: Feb. 18, 2025

(54) PERFORMANCE OF MAGNETIC CHANNEL JUNCTIONS

(71) Applicant: Marvell Asia Pte Ltd, Singapore (SG)

(72) Inventors: Peng Zhang, Los Angeles, CA (US); Runzi Chang, Saratoga, CA (US)

(73) Assignee: Marvell Asia Pte Ltd, Singapore (SG)

( * ) Notice: Subject to any disclaimer, the term of this patent is extended or adjusted under 35 U.S.C. 154(b) by 417 days.

(21) Appl. No.: 17/585,622

(22) Filed: Jan. 27, 2022

(65) Prior Publication Data
US 2022/0238147 A1     Jul. 28, 2022

Related U.S. Application Data

(60) Provisional application No. 63/142,996, filed on Jan. 28, 2021.

(51) Int. Cl.
| | | |
|---|---|---|
| *G11C 11/16* | (2006.01) | |
| *H01L 27/22* | (2006.01) | |
| *H01L 43/02* | (2006.01) | |
| *H01L 43/10* | (2006.01) | |
| *H01L 43/12* | (2006.01) | |
| *H10B 61/00* | (2023.01) | |

(Continued)

(52) U.S. Cl.
CPC ............ *G11C 11/161* (2013.01); *H10B 61/22* (2023.02); *H10N 50/01* (2023.02); *H10N 50/10* (2023.02); *H10N 50/80* (2023.02); *H10N 50/85* (2023.02)

(58) Field of Classification Search
CPC ........ H10N 50/10; H10N 50/01; H10N 50/85; H10N 50/80; G11C 11/161; H10B 61/00; H10B 61/22; H01L 21/02502
See application file for complete search history.

(56) References Cited

U.S. PATENT DOCUMENTS

| | | |
|---|---|---|
| 6,900,455 B2 | 5/2005 | Drewes |
| 9,988,715 B2 | 6/2018 | Nardi et al. |

(Continued)

OTHER PUBLICATIONS

Mantovan et al., "Fe3-δO4/MgO/Co Magnetic Tunnel Junctions Synthesized by Full in situ Atomic Layer and Chemical Vapour Deposition," Journal of Physics D: Applied Physics, vol. 47, No. 10, pp. 1-4, year 2014.

*Primary Examiner* — Shahed Ahmed
*Assistant Examiner* — Rhys Poniente Sheker
(74) *Attorney, Agent, or Firm* — Meitar Patents Ltd.; Daniel Kligler (57) ABSTRACT

A semiconductor device includes a magnetic tunnel junction (MTJ) and first and second electrodes. The MTJ includes: (a) a first ferromagnetic (FM) layer, configured to have a magnetic spin in a first spin direction, and retain the first spin direction while MTJ subjected to electrical current in first and second directions, (b) a second FM layer, configured to have the magnetic spin selectively altered between the first and second spin direction, in response to altering the electrical current between the first and second directions, respectively, and (c) a stack of tunnel barrier (TB) layers, having: a first TB layer disposed over the first FM layer and having a first morphological structure, and a second TB layer, disposed between the first TB layer and the second FM layer and having a second, different, morphological structure. The first and second electrodes are electrically connected to the first and second FM layers, respectively.

9 Claims, 2 Drawing Sheets

(51) Int. Cl.
  *H10N 50/01* (2023.01)
  *H10N 50/10* (2023.01)
  *H10N 50/80* (2023.01)
  *H10N 50/85* (2023.01)

(56) References Cited

U.S. PATENT DOCUMENTS

2019/0207091 A1* 7/2019 Kardasz .............. H01F 10/3286
2021/0184108 A1* 6/2021 Zhou ....................... H01L 29/82

* cited by examiner

FIG. 4

PERFORMANCE OF MAGNETIC CHANNEL JUNCTIONS

CROSS-REFERENCE TO RELATED APPLICATIONS

This application claims the benefit of U.S. Provisional Patent Application 63/142,996, filed Jan. 28, 2021, whose disclosure is incorporated herein by reference.

FIELD OF THE DISCLOSURE

The present invention relates generally to electronic devices, and particularly to methods and systems for improving the performance and production process of Magnetoresistive Random Access Memory (MRAM) devices.

BACKGROUND

Various techniques are known in the art for producing magnetic tunnel junctions (MTJs) of MRAM devices.

The description above is presented as a general overview of related art in this field and should not be construed as an admission that any of the information it contains constitutes prior art against the present patent application.

SUMMARY

An embodiment that is described herein provides a semiconductor device including a magnetic tunnel junction (MTJ), and first and second electrodes. The MTJ includes: (a) a first ferromagnetic (FM) layer, configured to have a magnetic spin in a first spin direction, and to retain the first spin direction while the MTJ is subjected to an electrical current in a first direction or in a second direction opposite the first direction, (b) a second FM layer, configured to have the magnetic spin selectively altered between the first spin direction and a second spin direction, in response to altering the electrical current between the first direction and the second direction, respectively, and (c) a stack of tunnel barrier (TB) layers, the stack including: (i) a first TB layer having a first morphological structure, the first TB layer being disposed over the first FM layer, and (ii) a second TB layer having a second morphological structure, different from the first morphological structure, the second TB layer being formed of a same material as the first TB layer and being disposed between the first TB layer and the second FM layer. The first and second electrodes are electrically connected to the first and second FM layers, respectively.

In some embodiments, the first morphological structure includes a polycrystalline structure of magnesium oxide (MgO). In other embodiments, the first TB layer has a thickness less than 1 nanometer. In yet other embodiments, the second morphological structure includes a monocrystalline structure of magnesium oxide (MgO).

In an embodiment, the second TB layer includes a stack of single-atom layers of the MgO, and has a thickness greater than 1 nanometer. In another embodiment, under predefined conditions of the electrical current, the first TB layer has a first dielectric constant, and the second TB layer has a second dielectric constant, different from the first dielectric constant, and, under the predefined conditions and altering of the electrical current between the first and second directions, the MTJ is configured to have a tunnel magnetoresistance ratio (TMR) greater than 100%. In yet another embodiment, the first TB layer has a first uniformity of thickness (UOT), and the second TB layer has a second UOT, different from the first UOT.

In some embodiments, (i) the first FM layer includes a first stack of multiple FM layers connecting between the first FM layer and the first electrode, and (ii) the second FM layer includes a second stack of multiple FM layers connecting between the second FM layer and the second electrode. In other embodiments, the semiconductor device includes a Magnetoresistive Random Access Memory (MRAM) device having at least a bit cell that includes the MTJ. In yet other embodiments, in response to applying the electrical current in the first direction, the MTJ has a first electrical resistance to the electrical current, and in response to applying the electrical current in the second direction, the MTJ has a second electrical resistance, different from the first electrical resistance.

There is additionally provided, in accordance with an embodiment, a method for producing a semiconductor device, the method including forming a first ferromagnetic (FM) layer using a first process type. A tunnel barrier (TB) layer having a monocrystalline structure is formed over the first FM layer using a second process type different from the first process type. A second FM layer using the first process type is formed over the TB layer.

In some embodiments, the method includes forming, before the first FM layer, an additional TB layer to be positioned between the first FM layer and the TB layer. In other embodiments, forming the additional TB layer includes using the first process type to form a magnesium layer over the first FM layer, and, before forming the TB layer, exposing the additional TB layer to oxygen to transform at least part of the magnesium layer into polycrystalline magnesium oxide (MgO). In yet other embodiments, the first process type includes a physical vapor deposition (PVD) process, and the second process type includes an atomic layer deposition (ALD) process.

In an embodiment, the PVD process is carried out in vacuum and forming the additional TB layer over the first FM layer while being in the vacuum, and exposing the additional TB layer to oxygen includes exposing the magnesium layer to atmospheric conditions before forming the TB layer using the ALD process. In another embodiment, forming the TB layer includes forming a stack of single-atom layers (SALs) over the polycrystalline MgO of the additional TB layer. In yet another embodiment, forming a given SAL of the SALs includes: (i) applying magnesium-containing precursors (MCP) to an outer surface, and subsequently (ii) exposing the MCP to active oxidants for forming an MgO SAL.

In some embodiments, the method includes applying a first purging process after applying the MCP, and applying a second purging process after forming the MgO SAL. In other embodiments, forming the stack of SALs includes forming a first SAL over the outer surface the polycrystalline MgO and forming a second SAL over the outer surface of the first SAL, to build up a plurality of SALs. In yet other embodiments, the method includes forming first and second electrodes, and: (i) forming the first FM layer includes forming a first stack of multiple FM layers connecting between the first FM layer and the first electrode, and (ii) forming the second FM layer includes forming a second stack of multiple FM layers connecting between the second FM layer and the second electrode.

The present disclosure will be more fully understood from the following detailed description of the embodiments thereof, taken together with the drawings in which:

DETAILED DESCRIPTION OF EMBODIMENTS

Magnetoresistive random-access memory (MRAM) is a type of non-volatile random-access memory device, which is typically formed on a semiconductor substrate and is configured to store data in magnetic domains. As opposed to other sorts of RAM semiconductor devices, such as, Flash, dynamic RAM (DRAM) and static RAM (SRAM), data in MRAM is not stored by trapping electric charge, but by using magnetic storage elements formed in the semiconductor substrate.

An MRAM device typically comprises a magnetic tunnel junction (MTJ) having magnetic domains formed in two ferromagnetic (FM) plates, referred to herein as first and second FM plates. Each of the first and second FM plates is configured to hold a magnetization as will be described in detail below. The MTJ further comprises a tunnel barrier (TB) layer, which is made from a thin insulating layer (e.g., having a thickness of about 3 nm or any other suitable thickness) and is disposed between the first and second FM plates. The first FM plate comprises a permanent magnet that is set to a particular polarity, whereas the magnetization of the second FM plate can be selectively altered to match the magnetization of an external field, so as to carry out data storage operations. A bit cell of the MRAM device may be implemented using any suitable type of transistor and an MTJ. The bit cell is configured to perform storage operations (e.g., read, write and erase) of an MRAM bit. An MRAM device typically comprises one or more arrays of such bit cells arranged in a grid. Each bit cell has an address for managing the storage operations of respective MRAM bits using a grid of bit lines and word lines for connecting between the bit cells and control circuitry configured to manage the storage operations.

In some MRAM devices, such as in spin-transfer torque (STT) and vertical transport MRAM (VMRAM), electrical current flows across the MTJ, i.e., through the first and second FM plates and the TB layer, and the MTJ uses spin-aligned (i.e., polarized) electrons to directly torque the magnetic domains. In other words, electrons flowing into a layer change their spin direction, and thereby, develop a torque that is transferred to the respective layer. The change in spin direction is used to carry out non-volatile storage operations in one or more respective MRAM bit cells. Such devices are based on a tunneling effect of the electrical current, therefore, the quality (e.g., uniformity and morphological structure) of the TB layer has a significant impact on the storage operations carried out using the MRAM device.

Embodiments of the present disclosure that are described herein, provide techniques for improving the quality of the TB layer(s) in an MTJ, so as to improve the quality of storage operations and the production yield of MRAM devices.

In some embodiments, a semiconductor-based MRAM device comprises: (i) an MTJ having first and second stacks of FM layers, and one or more TB layers, and (ii) first and second electrodes electrically connected to the first and second FM layers, respectively.

In some embodiments, the first stack of FM layers, also referred to herein as a first FM plate, comprises a stack of layers comprising a cobalt-iron-boron (CoFeB) reference layer, or any other suitable type of FM layer(s). The FM reference layer is configured to have a magnetic spin in a first spin direction, and to retain the first spin direction while the MTJ is subjected to an electrical current flowing through the MTJ in a first direction, or in a second direction opposite the first direction.

In some embodiments, the second stack of FM layers, also referred to herein as a second FM plate, comprises a stack of layers different from the stack of the reference layer, and yet, comprising a CoFeB free layer, or any other suitable type of FM layer. In some embodiments, in response to altering the electrical current between the first direction and the second direction, the second stack of FM layers is configured to have the magnetic spin altered between the first spin direction and a second spin direction, respectively.

In some embodiments, the MTJ comprises a stack of TB layers. The stack comprises first and second TB layers which, in the present example, are made from magnesium oxide (MgO), but have first and second morphological structures, respectively. In some embodiments, the first and second morphological structures are different from one another. For example, the first TB layer has a polycrystalline structure, and the second TB layer has a monocrystalline structure. In the context of the present disclosure and in the claims, the terms "monocrystalline structure," "monocrystalline morphological structure," "single crystal," and "monocrystalline morphology," are used interchangeably and refer to a material in which the crystal lattice of the entire sample (e.g., layer) is continuous and unbroken to the edges of the layer. Such layers do not have grain boundaries that affect the dielectric properties of the layer as will be described in greater detail below. Moreover, the terms "polycrystalline structure," "polycrystalline morphological structure," and "polycrystalline morphology," are used interchangeably and refer to a sample (e.g., layer) comprised of many crystals with different crystal orientations that are separated by grain boundaries which impact uniformity and consequently quality of the TB layer.

In some embodiments, a process for producing the MTJ comprises of three sets of process operations. In the first set of process operations, a physical vapor deposition (PVD) system is used to form the first electrode, the first stack of FM layers, and a thin magnesium layer (e.g., having a thickness between about 2 Angstroms and 3 Angstroms) that is formed over the CoFeB reference layer.

In some embodiments, after the first set of process operations, the outer surface of the thin magnesium layer is exposed to atmospheric conditions, and is oxidized to transform at least part of, and typically the entire thickness of the magnesium layer, into polycrystalline MgO, thereby forming the first TB layer.

In a subsequent second set of process operations, an atomic layer deposition (ALD) system, which is described in detail below, is used to form the second TB layer over the first TB layer. In a subsequent third set of process operations, a PVD system is used to form: (i) the second stack of FM layers over the second TB layer, and (ii) the second electrode formed over the second stack of FM layers. Note that each of the operations described above is carried out in vacuum. However, between the operations, outer surfaces of the stacks of the MTJ being processed are exposed to atmospheric conditions, which may result in undesired oxidation of the outer surfaces. In principle, it is possible to form all the layers of the MTJ in a single PVD system, and thereby, prevent undesired exposure to atmospheric conditions resulting in undesired oxidation of the outer surfaces. However, a PVD process may cause line defects (e.g., dislocations and grain boundaries) and point defects (e.g., Stoichiometric defects, Frenkel defects and Schottky defects) in the TB stack, which may reduce the uniformity of the dielectric properties of the TB stack. For example, the grain boundaries may form in the TB stack a path of an electrical short, which reduces the uniformity of the dielectric properties of the TB stack.

In some embodiments, in forming the second TB layer, the ALD process is configured to form a stack of single-atom layers (SALs) of MgO over the polycrystalline MgO of the first TB layer. Note that using an ALD process to form one SAL at a time improves the uniformity of thickness (UOT) of a given TB layer compared to that of a TB layer formed using a PVD process. In the present example, the second TB layer has a thickness greater than about 1 nm, e.g., between about 2 nm and 3 nm, and the stack of SALs has the monocrystalline structure that is typically free of or having a reduced number of line defects and/or point defects compared to that in a TB layer formed in a PVD process.

In such embodiments, the first TB layer (having the polycrystalline structure and thickness between about 2 Angstroms and 3 Angstroms, or any other suitable thickness less than about 1 nm) accounts for about 0.01% of the thickness of the TB stack, and the second TB layer (having the monocrystalline structure and thickness between about 2 nm and 3 nm, or any other suitable thickness greater than about 1 nm) accounts for about 99.99% of the thickness of the TB stack. This configuration improves the uniformity of the TB stack dielectric properties compared to that of a TB stack whose layers are formed using a PVD process and having a similar thickness.

The disclosed techniques reduce the number of defects and improve the uniformity of the TB stack. Therefore, the disclosed techniques improve the quality of storage operations (e.g., reduce the bit-error rate) in MTJ-based MRAM devices, and improve the yield in the production process of such MRAM devices.

The description above is presented as a general overview of embodiments of the present disclosure, which are described in detail herein.

Figure 1:
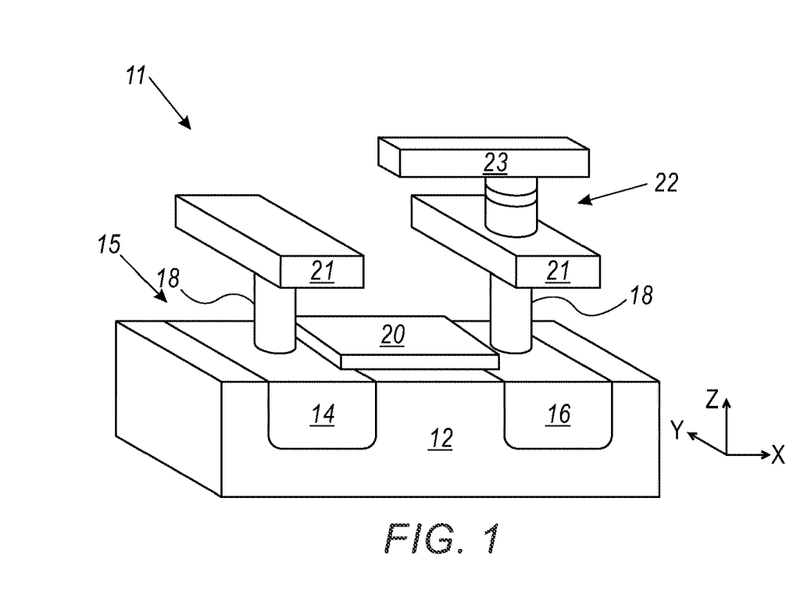
FIG. 1 is a schematic, pictorial illustration of a bit cell of a magnetoresistive random access memory (MRAM) device, in accordance with an embodiment that is described herein.

FIG. 1 is a schematic, pictorial illustration of a bit cell 11 of a magnetoresistive random access memory (MRAM) device, in accordance with an embodiment that is described herein. In some embodiments, the MRAM device, also referred to herein as a semiconductor device, is configured to perform storage operations (e.g., read, write and erase) of MRAM bits.

In some embodiments, the MRAM device comprises one or more memory blocks (not shown), each memory block comprises a plurality of bit cells 11 arranged in an array (not shown). Each array comprises a grid of bit lines 23 and word lines 21, and each bit cell 11 is connected to a respective bit line 23 and word line 21, and has an address in the respective array. The address of each bit cell 11 is used, e.g., by control circuitry (not shown) of the MRAM device, for managing the storage operations of bits of data in the respective bit cell 11.

In some embodiments, bit cell 11 of the MRAM device comprises: (i) a magnetic tunnel junction (MTJ) 22 described in detail in FIGS. 2 and 3 below, and (ii) a transistor 15 formed on a semiconductor substrate 12, typically a silicon wafer. In the present example, transistor 15 comprises a metal-oxide-semiconductor (MOS) field-effect transistor (FET), but in other embodiments, transistor 15 may comprise a finFET or a gate-all-around (GAA) transistor, or any other suitable device configurable to control the direction and other parameters of the electrical current applied to MTJ 22.

In some embodiments, the MRAM device may comprise n-type and p-type transistors 15. For example, in a p-type transistor 15, substrate 12 is implanted with n-type ions and a source 14 section and a drain 16 section of transistor 15 are formed by implanting p-type ions in the respective sections of substrate 12. Similarly, in an n-type transistor 15, substrate 12 is implanted with p-type ions and source 14 and drain 16 sections are formed by implanting n-type ions in the respective sections of substrate 12. Transistor 15 further comprises a gate electrode referred to herein as a gate 20, which is configured to form or cancel a depletion zone between source 14 and drain 16 (e.g., along the X-axis of the XYZ coordinate system. The formation or cancellation of the depletion zone, together with application of voltage to the source and/or drain, enable on/off switching of transistor 15.

In the example of FIG. 1, conductive contacts 18 are formed between: (i) source 14 and/or drain 16, and (ii) word line(s) 21, so as to conduct electrical signals (e.g., current flowing) between transistor 15 and MTJ 22. In other embodiments, the MRAM device may comprise additional contacts 18 for connecting between: (i) gate 20, and (ii) one or more bit lines 23 and word lines 21, and other suitable type of interconnecting components used in Very large-scale integration (VLSI) devices.

This particular configuration of bit cell 11 of the MRAM device is shown by way of example. Embodiments of the present invention, however, are by no means limited to this specific sort of example configuration of bit cell, and the principles described herein may similarly be applied to other sorts of MRAM devices.

Figure 2A:
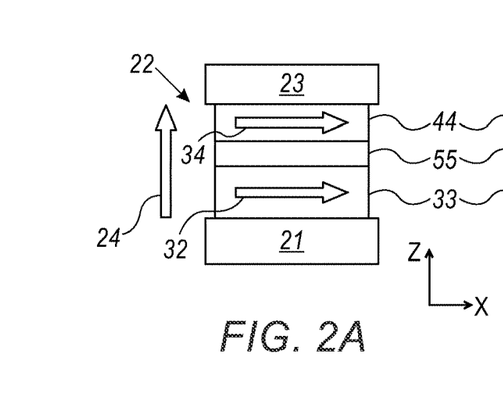
FIGS. 2A and 2B are schematic sectional views of a magnetic tunnel junction (MTJ) of the MRAM device in different storage states, in accordance with embodiments that are described herein.
Figure 2B:
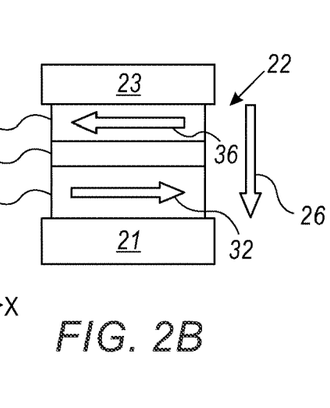

FIGS. 2A and 2B are schematic sectional views of MTJ 22 of bit cell 11 of the MRAM device, in accordance with another embodiment that is described herein. FIGS. 2A and 2B present different storage states of MTJ 22, also referred to herein as a parallel storage state and an anti-parallel storage state, respectively. The storage states are defined by the arrangement of the magnetic spins of electrons in ferromagnetic (FM) layers of MTJ 22 in response to current flowing through MTJ 22 in different directions.

In the example of FIGS. 2A and 2B, MTJ 22 comprises: (i) a first stack of ferromagnetic (FM) layers, also referred to herein as a first FM plate 33, (ii) a second stack of FM layers, also referred to herein as a second FM plate 44, and (iii) one or more (typically a stack of two) tunnel barrier (TB) layers, also referred to herein as a TB stack 55, which is an electrical insulator formed between first FM plate 33 and second FM plate 44. The structure of FM plates 33 and 44 and TB stack 55 is described in more detail in FIG. 3 below In some embodiments, first FM plate 33 comprises a bottom electrode (shown in FIG. 3 below) formed over word line 21, and second FM plate 44 comprises a top electrode (shown in FIG. 3 below), which is the uppermost layer of MTJ 22 (along the Z-axis), and bit line 23 is formed over the top electrode.

Tunnel Magnetoresistance Ratio in a Magnetic Tunnel Junction

Reference is now made to FIG. 2A showing MTJ 22 in the parallel storage state. In some embodiments, MTJ 22 is subjected to an electrical current in a direction 24 (e.g., electrical current that flows from word line 21 toward bit line 23). In this storage state, first FM plate 33 is configured to have a magnetic spin in a spin direction 32 (e.g., parallel to the X-axis), and second FM plate 44 is configured to have a magnetic spin in a spin direction 34, which is parallel to direction 32. In this state, the magnetic spin directions in FM plates 33 and 44 MTJ 22 are parallel to one another, and the electrical resistance of MTJ 22 to the current flow is referred herein as $R_p$.

Reference is now made to FIG. 2B showing MTJ 22 in the anti-parallel storage state. In some embodiments, MTJ 22 is subjected to an electrical current in a direction 26, which is opposite to direction 24 (e.g., the electrical current flows from bit line 23 toward word line 21). In this storage state, first FM plate 33 is configured to retain the magnetic spin in first spin direction 32, and second FM plate 44 is configured to have the magnetic spin in a spin direction 36, which is opposite to spin direction 34 of FIG. 2A, and is anti-parallel to spin direction 32.

In some embodiments, in the parallel state shown in FIG. 2A, the electrical resistance of MTJ 22 to the current flowing in direction 24 is denoted $R_p$, and in the anti-parallel state shown in FIG. 2B, the electrical resistance of MTJ 22 to the current flowing in direction 26 is denoted $R_{ap}$, which is different from, and typically larger than $R_p$. Note that the terms "parallel" and "anti-parallel" refer to the alignment of the magnetization of MTJ 22 in response to the current flowing in directions 24 and 26, respectively.

In some embodiments, the resistance difference between $R_p$ and $R_{ap}$ is indicative of the quality and reliability of the storage capability of bit cell 11. For example, the parallel storage state is defined as a bit memory "0" state, and the anti-parallel storage state is defined as a bit memory "1" state. In some embodiments, a large resistance difference between $R_p$ and $R_{ap}$ is indicative of high differentiation between the 0 and 1 states of the bit memory, and a small resistance difference between $R_p$ and $R_{ap}$ may result in storage operations errors in bit cell 11. For example, insufficient resistance difference (e.g., about 10 percent or less) between $R_p$ and $R_{ap}$ may result in high bit-error rate (BER) in the respective bit cell 11 of the MRAM device. Moreover, insufficient difference between $R_p$ and $R_{ap}$ may result in disqualifying the respective MRAM device in testing during and/or after concluding the production process of the MRAM device.

In some embodiments, a quality factor may be used for measuring the quality of MTJ 22, and for monitoring the production process of the MRAM device. For example, a tunnel magnetoresistance ratio (TMR) can be used to measure the relative resistance difference in response to changing the direction of the electrical current, e.g., between directions 24 and 26. In other words, the TMR, which is given in equation (1) below, measures the relative resistance change between the parallel and anti-parallel states of MTJ 22:

$$TMR = \frac{Rap - Rp}{Rp} \qquad (1)$$

In some embodiments, the electrical current flows through TB stack 55 in a tunneling effect, in which case the electrical resistance in the parallel state and in the anti-parallel state depends on the dielectric properties of TB stack 55.

In some cases, line defects such as dislocations and grain boundaries, and point defects (such as Stoichiometric defects, Frenkel defects and Schottky defects), in the morphological structure of TB stack 55, typically reduce the uniformity of the dielectric properties of TB stack 55, and thereby, may reduce the TMR. For example, the grain boundaries (as well as edge dislocations and screw dislocations) may form in TB stack 55 a path of an electrical short, which reduces the difference between $R_p$ and $R_{ap}$ may result in storage operations errors in bit cell 11. In the present example, TMR larger than about 100% typically results in high-quality MTJ having zero or low BER, whereas TMR smaller than about 10% typically results in high BER that, in some case, may cause disqualification of the MRAM device.

In some embodiments, the crystalline structure of TB stack 55 affects the dielectric properties of TB stack 55. In some embodiments, a polycrystalline structure of the layers of TB stack 55 has grain boundaries between the crystals that reduce the local electrical resistance to the electrical current flowing through TB stack 55. For example, small grains in TB stack 55 result in more grain boundaries compared TB stack 55 having large grains. The larger density of grain boundaries reduces the dielectric constant of TB stack 55, and thereby, reduces the TMR of MTJ 22. The grain size of TB stack 55 depends on various production processes (e.g., thermal processes) of the MRAM device.

In other embodiments, a monocrystalline structure does not have grain boundaries, and therefore, may have a higher dielectric constant and improved uniformity of dielectric properties compared to that of a polycrystalline structure. In such embodiments, the TMR of a first MTJ having a polycrystalline morphology in the TB stack is typically less than the TMR of a second MTJ having a monocrystalline morphology in the TB stack.

In some embodiments, in an MRAM device having a monocrystalline TB stack, (i) the TMR level of each MTJ, and (ii) the uniformity of TMRs among MTJs of the MRAM device, are typically larger compared to those of an MRAM device having a polycrystalline TB stack. Thus, a monocrystalline morphology of TB stack 55 is expected to improve the quality and reliability of bit cells 11 of the MRAM device.

This particular configuration of MTJ 22 is shown by way of example, in order to illustrate certain problems that are addressed by embodiments of the present invention and to demonstrate the application of these embodiments in enhancing the performance of such an electronic device. Embodiments of the present invention, however, are by no means limited to this specific sort of example configuration of MTJ and direction of electrical currents, and the principles described herein may similarly be applied to other sorts of MTJs of any suitable type of MRAM devices.

Figure 3:
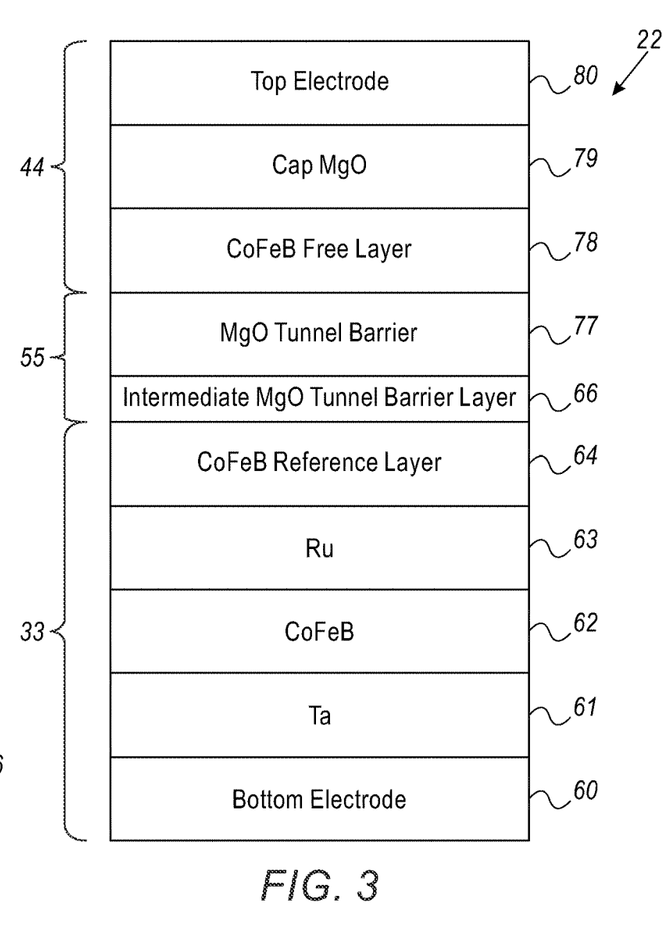
FIG. 3 is a schematic sectional view of layers stacked in the MTJ of FIGS. 1 and 2, in accordance with an embodiment that is described herein.

Controlling the Morphological Structure of the Tunnel Barrier in a Magnetic Tunnel Junction FIG. 3 is a schematic sectional view of the layers of MTJ 22, in accordance with an embodiment that is described herein.

In some embodiments, MTJ 22 comprises FM plate 33, TB stack 55 formed over FM plate 33, and FM plate 44 formed over TB stack 55.

In some embodiments, FM plate 33 is configured to have a magnetic spin in spin direction 32 (of FIGS. 2A and 2B), and to retain spin direction 32 while MTJ 22 is selectively subjected to an electrical current in direction 24 or in direction 26, which is opposite direction 24. In the present example, FM plate 33 comprises a stack of the following layers: (i) a bottom electrode layer 60, which is disposed over word line 21, is made from copper or tungsten and having a thickness between about 2 nm and 10 nm, (ii) a layer 61 made from tantalum or any other suitable type of rare transition metal, and having a thickness between about 2 nm and 5 nm, (iii) a layer 62 made from cobalt-iron-boron (CoFeB), and having a thickness between about 1 nm and 2 nm, (iv) a layer 63 made from ruthenium or any other suitable type of rare transition metal, and having a thickness between about 1 nm and 2 nm, and (v) a reference layer 64 made from CoFeB and having a thickness between about 1 nm and 3 nm.

In some embodiments, spin direction 32 may be applied only to layer 64, and not to the layers of FM plate 33.

In the context of the present disclosure, the terms "about" or "approximately" for any numerical values or ranges indicate a suitable dimensional tolerance that allows the part or collection of components to function for its intended purpose as described herein.

In some embodiments, TB stack 55 is formed over layer 64 of FM plate 33, and comprises an intermediate TB layer 66, which is made from magnesium oxide (MgO), and in the present example, has a polycrystalline morphological structure and a thickness between about 2 Angstroms and 3 Angstroms. As described above, intermediate TB layer 66 (also referred to herein as TB layer 66, for brevity, or a first TB layer) is typically being disposed over layer 64 of FM plate 33.

In some embodiments, TB stack 55 comprises a TB layer 77, which is also made from MgO, and has a monocrystalline morphological structure and a thickness between about 2 nm and 3 nm. TB layer 77 is also referred to herein as a second TB layer. In the present example, TB layer 77 is formed over intermediate TB layer 66. Note that even though both TB layers 66 and 77 are made from MgO, they differ from one another in: (a) the morphological structure, and (b) the thickness. Moreover, TB layers 66 and 77 are produced using different processes as will be described in detail below.

As described in FIGS. 2A and 2B above, the monocrystalline morphological structure increases the dielectric constant of TB stack 55, and therefore, increases the TMR of MTJ 22 and improves the uniformity of TMR among the MTJs (e.g., MTJs 22) of the MRAM device.

In some embodiments, intermediate TB layer 66 that has the polycrystalline structure accounts for about 0.01% of the thickness of TB stack 55, and TB layer 77 that has the monocrystalline structure, accounts for about 99.99% of the thickness of TB stack 55. In such embodiments, due to the large difference in thickness, the dielectric constant of TB stack 55 is mostly determined by the dielectric constant of TB layer 77, which is typically substantially larger than that of intermediate TB layer 66 for the reasons described above (i.e., morphological structure).

In some embodiments, even though both are made from the same material (e.g., MgO) and are stacked in TB stack 55, TB layers 66 and 77 are formed using different processes resulting in respectively different morphological structures. The process flow is described in detail in FIG. 4 below, but in essence, intermediate TB layer 66 is formed together with layers 60-64 of FM plate 33, in a physical vapor deposition (PVD) carried out in vacuum. In some embodiments, intermediate TB layer 66 is formed in two operations: (i) the PVD process is used to dispose a magnesium layer as the outer layer over FM plate, and (ii) the magnesium layer is exposed to atmospheric conditions and is being oxidized to transform at least part of, and typically the entire thickness of the magnesium layer, into MgO layer having the polycrystalline morphological structure. In the present example, the exposure of the magnesium layer to the atmospheric conditions is carried out when the wafer (e.g., substrate 12) is moved from the vacuum environment of the PVD process, to another process tool described below. The oxygen of the atmospheric conditions is oxidizing the surface of the magnesium layer.

In some embodiments, the magnesium layer protects the surface of reference layer 64 from being oxidized, and at the same time itself being transformed into MgO layer, which is the same material as intermediate TB layer 66, albeit having a different morphological structure in an embodiment.

In some embodiments, after the formation of intermediate TB layer 66, an atomic layer deposition (ALD) system is used to form TB layer 77 over intermediate TB layer 66. The similar material (MgO) improves the compatibility, and therefore, the adhesion and smooth interface (e.g., without or almost without point defects) between TB layers 66 and 77. The process flow is described in more detail in FIG. 4 below.

In some embodiments, the ALD process for producing TB layer 77 is configured to form a stack of single-atom layers (SALs) of MgO over the polycrystalline MgO of intermediate TB layer 66. Moreover, due to the ability to form one SAL at a time, the ALD process has improved uniformity of thickness (UOT) compared to that of the PVD process. More specifically, by using the ALD process instead of the PVD process, the UOT of TB layer 77 is improved in a device level (e.g., between MTJs 22 of the same MRAM device), but a greater improvement of the UOT is obtained in wafer level (e.g., between MTJs 22 at the center and at the edge of the wafer).

In such embodiments, due to the stacking of the single-atom layers in the ALD process, TB layer 77 has an Angstrom-level or even sub-Angstrom level of thickness uniformity. Moreover, the monocrystalline structure that is typically free of linear defects and/or point defects, or having a reduced number of point defects compared to that of an MgO layer having the same thickness, which is formed using a PVD process or another deposition process. Thus, the dielectric constant of TB layer 77 is larger than that of intermediate TB layer 66. Furthermore, in view of the improved UOT and the difference in morphological structure, the uniformity of the dielectric constant of TB layer 77, within each MTJ 22 and between different MTJs 22, is improved compared to that of intermediate TB layer 66 (e.g., due to the UOT difference, and the presence of grain boundaries and variable grain size in intermediate TB layer 66).

In some embodiments, FM plate 44 of MTJ 22 comprises a stack of the following layers: (i) a free layer 78, which is made from CoFeB or any other suitable FM material, is disposed over TB layer 77, and having a thickness between about 1 nm and 2 nm, (ii) a Cap layer 79, which is made from MgO, is disposed over free layer 78 and has a thickness between about 1 nm and 2 nm, (in the present example, Cap layer 79 helps to keep the programmed state of free layer 78), and (iii) a top electrode layer 80 made from copper or tungsten like bottom electrode 60 and having a similar thickness, e.g., between about 2 nm and 10 nm. In the present example, top electrode layer 80 is disposed over Cap layer 79, and bit line 23 is disposed over top electrode layer 80 as shown in FIG. 1 above.

This particular configuration of MTJ 22 is provided by way of example, in order to illustrate certain problems that are addressed by embodiments of the present invention and to demonstrate the application of these embodiments in enhancing the performance of such a magnetic tunnel junction (MTJ). Embodiments of the present invention, however, are by no means limited to this specific sort of example configuration of MTJ 22, and the principles described herein may similarly be applied to other sorts of MTJs of any suitable type of MRAM devices. More specifically, the number of layers, the thickness of each layer and the material(s) and electrical properties of each layer are provided by way of example, and in other embodiments, MTJ 22 may comprise any other suitable combination of suitable layers, in addition to or instead of one or more of the layers described above.

Figure 4:
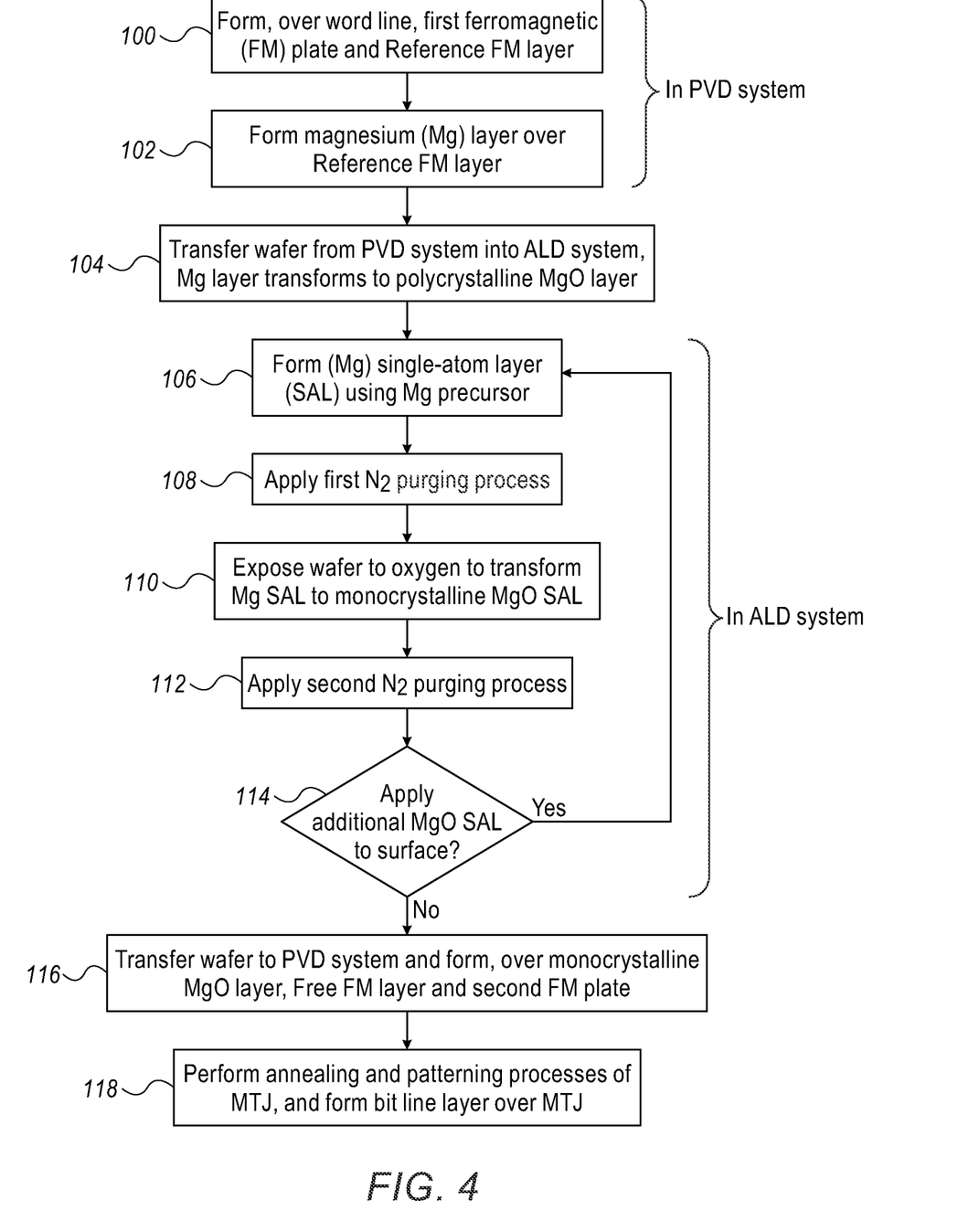
FIG. 4 is a flow chart that schematically illustrates a method for producing the MTJ of FIG. 3, in accordance with an embodiment that is described herein.

FIG. 4 is a flow chart that schematically illustrates a method for producing MTJ 22, in accordance with an embodiment that is described herein.

The method begins at first FM stack formation operation 100 for producing FM plate 33. Operation 100 begins with inserting a silicon wafer (e.g., substrate 12) having transistors 15 and word lines 21 into a PVD system that operates in vacuum and has multiple process chambers and one or more robots for transferring the wafer, while in vacuum, between the process chambers.

In some embodiments, the following layers of FM plate 33 are formed in operation 100: (i) bottom electrode layer 60, which is disposed over word line 21, made from copper or tungsten or any other suitable metal or alloy, and having a thickness between about 2 nm and 10 nm, (ii) layer 61, which is made from tantalum and having a thickness between about 2 nm and 5 nm, is formed over layer 60 (iii) layer 62, which is made from CoFeB and having a thickness between about 1 nm and 2 nm, is formed over layer 61, (iv) layer 63, which is made from ruthenium and having a thickness between about 1 nm and 2 nm, is formed over layer 62, and (v) reference layer 64, which is made from CoFeB and having a thickness between about 1 nm and 3 nm, is formed over layer 63.

In some embodiments, layers 60, 61 and 63 are formed, respectively, in first, second and third chambers of the PVD system, and layers 62 and 64 that are made from similar materials are formed in a fourth chamber of the PVD system. Note that any unintended exposure to oxygen may result in undesired formation of an oxide layer on one or more of layers 60-64. However, because layers 60-64 are formed in vacuum, none of these layers is unintentionally exposed to oxygen of the atmospheric conditions surrounding the PVD system. In such embodiments, the PVD process enables tight preservation of the FM properties of FM plate 33.

At a magnesium layer formation operation 102, the wafer is retained in the vacuum of the PVD system and is transferred to a magnesium deposition chamber of the PVD system. In some embodiments, magnesium layer that has a thickness of about 2 Angstroms or 3 Angstroms, is formed over CoFeB reference layer 64. Note that after concluding operation 102, the wafer has FM plate 33 disposed over word line 21, and the magnesium layer formed over CoFeB reference layer 64 of FM plate 33.

At a first barrier layer formation operation 104, the wafer is transferred from the PVD system and is inserted into the ALD system described in FIG. 3 above. Note that after disposing the magnesium layer, CoFeB reference layer 64 cannot be exposed to the oxygen or to any other undesired gas of the atmospheric conditions surrounding the PVD system. In some embodiments, while the wafer is retained in the atmospheric conditions, the surface of the magnesium layer is exposed to the oxygen of the atmospheric conditions, and the magnesium layer is transforms to polycrystalline MgO layer to form intermediate TB layer 66 described in detail in FIG. 3 above. Note that magnesium has affinity to oxygen, and therefore the formation of intermediate TB layer 66 may be obtained while transferring the wafer between the PVD and the ALD systems.

In other embodiments, the oxidation of the magnesium layer and the formation of intermediate TB layer 66, may be enhanced by placing the wafer in oxygen-rich environment (e.g., fluid comprising oxygen-rich aerosols, or high concentration of oxygen gas) and/or by increasing the temperature of the wafer, so as to increase the oxidation-rate of the magnesium layer.

In alternative embodiments, it is possible to apply a controlled oxidation process to the magnesium layer, so as to enhance the formation of any other suitable morphological structure of intermediate TB layer 66. For example, intermediate TB layer 66 may have monocrystalline structure or any other morphological structure. As described in FIG. 3 above, the thickness of intermediate TB layer 66 is about 2 Angstroms or 3 Angstroms, so the impact of intermediate TB layer 66 on the dielectric properties of TB stack 55 is almost negligible.

Note that after concluding operation 104, the wafer has a backside outer surface made from silicone of the wafer, and a frontside surface made from MgO of intermediate TB layer 66.

After the wafer is inserted into the ALD system, operations 106, 108, 110 and 112 are carried out within the ALD system to form a single-atom layer (SAL) of TB layer 77 described in detail in FIG. 3 above. Note that operations 106, 108, 110 and 112 are carried out in multiple iterations, each iteration used to form an additional SAL, so that TB layer 77 comprises a stack of multiple SALs. At a magnesium SAL formation operation 106, magnesium-containing precursors (MCP) are applied to the frontside surface of the wafer. In some embodiments, in the first iteration, the frontside surface comprises the MgO polycrystalline structure of intermediate TB layer 66, from the second iteration and on, the frontside surface of the wafer comprises the MgO polycrystalline morphological structure of the uppermost SAL of TB layer 77.

At a first purging operation 108, nitrogen ($N_2$) gas, or any other suitable gas (or fluid) is applied to the ALD process chamber, e.g., for evacuating the precursors.

At an oxidation operation 110, the surface of the MCP-based magnesium SAL is exposed to oxygen (in the ALD process chamber), so as to transform the magnesium SAL into a MgO SAL having a monocrystalline structure.

At a second purging operation 112, nitrogen ($N_2$) gas, or any other suitable type of gas or fluid, is applied to the ALD process chamber for evacuating the oxygen and preparing the outer surface of the wafer for the next process. Note that after concluding operation 110, a layer of MgO is formed on the outer surface of the wafer. In some embodiments, operations 106-110 constitute a dose-purge-dose-purge sequence of a binary ALD process, and the growth of the monocrystalline MgO layer per cycle depends, inter alia, on various parameters, such as the precursor pressure in operation 106, and the sticking probability of the precursors on the surface of the MgO layer. The sticking probability depends, inter alia, on the quality of the surface preparation. For example, residues of polymers landing on the outer surface of the MgO layer typically reduce sticking probability, interfere with the formation of SALs and may cause defects that reduce the production yield and/or the reliability of MTJ 22.

In some embodiments, TB layer 77 typically comprises a stack of multiple monocrystalline MgO SALs, each of which formed in operations 106-110 described above. The number of monocrystalline MgO SALs is predefined in accordance with the required dielectric properties of TB stack 55. In the present example, TB layer 77 has a thickness between about 2 nm and 3 nm, so TB layer 77 comprises between about 5 and 20 monocrystalline MgO SALs, for example, about 10 monocrystalline MgO SALs.

At a decision operation 114, the required number and the actual number of the formed monocrystalline MgO SALs are compared. In some embodiments, a processor of the ALD system holds a counter indicative of the present number of MgO SALs formed in the ALD process, and a threshold indicative of the number of the monocrystalline MgO SALs required for producing TB layer 77. In case the number of SALs counted by the counter is smaller than the threshold, the method loops back to operation 106. In case the number in the counter is equal to (or exceeds) that in the threshold, the method proceeds to a second FM stack formation operation 116 for producing FM plate 44. In operation 116 the wafer is transferred from the ALD system to a PVD system to form FM plate 44.

Note that in principle, it is possible to form intermediate TB layer 66 from any other suitable material, other than MgO. In some embodiments, when both TB layers 66 and 77 are made from MgO (or from any other suitable material), the interface between TB layers 66 and 77 is typically free of, or having a reduced number of point defects (e.g., Stoichiometric defects, Frenkel defects and Schottky defects) and line defects (e.g., dislocations), compared to that of intermediate TB layer 66 and TB layer 77 are made from different materials.

In some embodiments, the layers of FM plate 44 are formed in the PVD system in vacuum using the techniques described in operation 100 above, with the required changes. In the present example, FM plate 44 is formed using the following processes of operation 116: (i) free layer 78, which is made from CoFeB and having a thickness between about 1 nm and 2 nm, is disposed over TB layer 77, (ii) Cap layer 79, which is made from MgO and has a thickness between about 1 nm and 2 nm, is disposed over free layer 78, and (iii) top electrode layer 80, which is made from copper or tungsten and having a thickness between about 2 nm and 10 nm, is formed over Cap layer 79. After concluding the processes of operation 116, all the layers of MTJ 22 are formed and stacked together, as shown and described in detail in FIG. 3 above.

At an operation 118 that concludes the method, one or more annealing processes are carried out for optimizing the structure of MTJ 22, and for patterning MTJ 22, e.g., to the structure shown in FIG. 1 above. The annealing processes may be used for improving the interfaces between the layers of MTJ 22, and/or for reducing residues of point defects and line defects within and between the layers of TB stack 55. Moreover, after concluding the formation of MTJ 22, bit line 23 is disposed over top electrode layer 80 as shown in FIG. 1 above. Note that one or more of the annealing processes may be carried out after concluding the production of bit cell(s) 11, e.g., before or during the assembly and/or packaging of the MRAM device.

The method of FIG. 4 is provided by way of example and is simplified for the sake of presentation clarity. In other embodiments, the techniques described above may be applied, with the required changes, to any other suitable type of layers: (i) made from any other suitable materials, (ii) having any suitable thickness, (iii) arranged in any other suitable structures, and (iv) formed using any suitable processes similar to or different from the PVD and ALD processes described above.

Moreover, a suitable method for producing MTJ 22 or any other sort of MTJ, may use the operations of FIG. 4 using any other suitable order of operations.

It is noted that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A semiconductor device, comprising:
a magnetic tunnel junction (MTJ), comprising:
a first ferromagnetic (FM) layer, which is configured to have a magnetic spin in a first spin direction, and to retain the first spin direction while the MTJ is subjected to an electrical current in a first direction or in a second direction opposite the first direction;
a second FM layer, which is configured to have the magnetic spin selectively altered between the first spin direction and a second spin direction, in response to altering the electrical current between the first direction and the second direction, respectively; and
a stack of tunnel barrier (TB) layers, the stack comprising: (i) a first TB layer having a polycrystalline structure, the first TB layer being disposed over the first FM layer, and (ii) a second TB layer having a monocrystalline structure, the second TB layer being formed of a same material as the first TB layer and being disposed between the first TB layer and the second FM layer; and
first and second electrodes electrically connected to the first and second FM layers, respectively.

2. The semiconductor device according to claim 1, wherein the first TB layer has a thickness less than 1 nanometer.

3. The semiconductor device according to claim 1, wherein the first TB layer and the second TB layer comprise magnesium oxide (MgO).

4. The semiconductor device according to claim 3, wherein the second TB layer comprises a stack of single-atom layers of the MgO, and has a thickness greater than 1 nanometer.

5. The semiconductor device according to claim 1, wherein, under predefined conditions of the electrical current, the first TB layer has a first dielectric constant, and the second TB layer has a second dielectric constant, different from the first dielectric constant, and wherein, under the predefined conditions and altering of the electrical current between the first and second directions, the MTJ is configured to have a tunnel magnetoresistance ratio (TMR) greater than 100%.

6. The semiconductor device according to claim 1, wherein the first TB layer has a first uniformity of thickness (UOT) and the second TB layer has a second UOT, different from the first UOT.

7. The semiconductor device according to claim 1, wherein (i) the first FM layer comprises a topmost first FM layer coupled to the first TB layer, and a first stack of multiple FM layers connecting between the topmost first FM layer and the first electrode, and (ii) the second FM layer comprises a bottommost second FM layer coupled to the second TB layer, and a second stack of multiple FM layers connecting between the bottommost second FM layer and the second electrode.

8. The semiconductor device according to claim 1, wherein the semiconductor device comprises a Magnetoresistive Random Access Memory (MRAM) device having at least a bit cell that comprises the MTJ.

9. The semiconductor device according to claim 1, wherein in response to applying the electrical current in the first direction, the MTJ has a first electrical resistance to the electrical current, and in response to applying the electrical current in the second direction, the MTJ has a second electrical resistance, different from the first electrical resistance.

\* \* \* \* \*